(12) United States Patent
Hsu et al.

(10) Patent No.: US 10,777,580 B2
(45) Date of Patent: Sep. 15, 2020

(54) DISPLAY PANEL HAVING A COLOR BLOCK NOT OVERLAPPING OPENINGS IN LIGHT SHIELDING LAYER

(71) Applicant: INNOLUX CORPORATION, Jhu-Nan, Miao-Li County (TW)

(72) Inventors: Hsu-Kuan Hsu, Jhu-Nan (TW); Hsia-Ching Chu, Jhu-Nan (TW); Chien-Hung Chen, Jhu-Nan (TW); Kuei-Ling Liu, Jhu-Nan (TW); Mei-Chun Shih, Jhu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 16/239,283

(22) Filed: Jan. 3, 2019

(65) Prior Publication Data

US 2019/0139993 A1 May 9, 2019

Related U.S. Application Data

(63) Continuation of application No. 14/806,484, filed on Jul. 22, 2015, now Pat. No. 10,211,226.

(30) Foreign Application Priority Data

Apr. 10, 2015 (TW) .............................. 104111670 A

(51) Int. Cl.
| | |
|---|---|
| *H01L 27/12* | (2006.01) |
| *G02F 1/1335* | (2006.01) |
| *H01L 51/52* | (2006.01) |
| *H01L 27/32* | (2006.01) |
| *G02F 1/1362* | (2006.01) |

(52) U.S. Cl.
CPC .... *H01L 27/1214* (2013.01); *G02F 1/133512* (2013.01); *G02F 1/133514* (2013.01); *G02F 1/133516* (2013.01); *H01L 27/322* (2013.01); *H01L 51/5284* (2013.01); *G02F 1/136209* (2013.01); *G02F 2001/136222* (2013.01)

(58) Field of Classification Search
CPC combination set(s) only.
See application file for complete search history.

(56) References Cited

U.S. PATENT DOCUMENTS

| | | |
|---|---|---|
| 2005/0105017 A1 | 5/2005 | Choi et al. |
| 2010/0001939 A1 | 1/2010 | Ochiai et al. |

(Continued)

FOREIGN PATENT DOCUMENTS

| | | |
|---|---|---|
| CN | 103513470 | 1/2014 |
| JP | 2010097214 | 4/2010 |

*Primary Examiner* — Lauren Nguyen
(74) *Attorney, Agent, or Firm* — Liu & Liu

(57) ABSTRACT

A display panel is disclosed. The display panel includes a first substrate, a light shielding layer and a color block. The first substrate has a first surface with a first edge and a second edge, and the second edge is connected to the first edge. The second edge substantially extends along a first direction. The light shielding layer is disposed on the first surface and includes a plurality of openings. The color block closest to the second edge is disposed on the light shielding layer and extending along the first direction. The color block does not overlap the plurality of openings. Wherein the color block has a third edge which is closest to the second edge, and the third edge is not aligned evenly.

18 Claims, 6 Drawing Sheets

(56) References Cited

U.S. PATENT DOCUMENTS

2012/0105337 A1     5/2012  Jun et al.
2012/0120337 A1*    5/2012  Ji ..................... G02F 1/133514
                                                            349/39
2012/0154732 A1     6/2012  Morita

* cited by examiner

DISPLAY PANEL HAVING A COLOR BLOCK NOT OVERLAPPING OPENINGS IN LIGHT SHIELDING LAYER

CROSS REFERENCE TO RELATED APPLICATIONS

This application is a Continuation Application (CA) of an earlier filed, pending, application, having application U.S. Ser. No. 14/806,484 and filed on Jul. 22, 2015, the content of which, including drawings, is expressly incorporated by reference herein.

BACKGROUND

Technical Field

The invention relates to a display panel, in particular to a display panel having high reliability.

Related Art

As the progressive of technology, flat display panels are widely applied to various fields. Because it has advantages of compact volume, low power consumption, and non-radiation, it gradually replaces traditional CRT (cathode ray tube) display device and applies to various electronic products, for example, mobile phone, portable multimedia device, notebook computer, LCD (liquid crystal display) TV or LCD monitor, etc.

Taking LCD device for example, the LCD device includes a display panel and a backlight module. The display panel includes a thin film transistor (TFT) substrate, a color filter substrate and a liquid crystal layer sandwiched between both the substrates. During manufacturing the conventional display panel, for example, sealant is applied to the periphery of the TFT substrate, and the liquid crystals are injected into the space formed by the sealant. Then, the TFT substrate is attached correspondingly to the color filter substrate in vacuum environment and the sealant is solidified to obtain an LCD panel.

Because numerous enterprises have entered the market of LCD device, this market is very competitive. Therefore, each enterprise is determined to enhance display quality and reliability thus raising competitiveness and increasing its market share.

SUMMARY

A display panel is provided with better display quality and reliability to raise product competitiveness.

A display panel includes a first substrate, a light shielding layer, a first color block and a second color block adjacent to the first color block, a second substrate, and a display medium layer. The light shielding layer is disposed on the first substrate and has a first opening adjacent to a first edge of the first substrate and a second opening adjacent to the first opening. The first color block and the second color block are respectively disposed on the light shielding layer along a first direction. The first opening is filled with partial of the first color block, and the first color block overlaps partial of the light shielding layer. The second opening is filled with partial of the second color block, and the second color block overlaps partial of the shielding layer. The first color block on the light shielding layer has a first overlap portion adjacent to the first edge, the second color block on the light shielding layer has a second overlap portion adjacent to the first edge, and the area of the first overlap portion and the area of the second overlap portion are different. The display medium layer is sandwiched between the first substrate and the second substrate.

A display panel includes a first substrate, a light shielding layer, a second substrate, a display medium layer, a first color block and a second color block adjacent to the first color block, a third color block closest to a second edge of the first substrate. The light shielding layer is disposed on the first substrate and has a first opening closest to a first edge of the first substrate, a second opening adjacent to the first opening and a third opening relatively away from the first edge along a first direction. The first color block and the second color block are respectively disposed on the light shielding layer along the first direction. The first opening and the third opening are filled with partial of the first color block, and the first color block overlaps partial of the shielding layer. The second opening is filled with partial of the second color block, and the second color block overlaps partial of the light shielding layer. The third color block is disposed on the light shielding layer along the first direction, the second edge connects to the first edge. Along a second direction substantially perpendicular to the first direction, the shortest distance from the portion of the third color block corresponding to the first opening to the second edge is different from the shortest distance from the portion of the third color block corresponding to the third opening to the second edge. The display medium layer is sandwiched between the first substrate and the second substrate.

A display panel includes a first substrate, a light shielding layer, a second substrate and a display medium layer, a first color block and a second color block adjacent to the first color block. The light shielding layer is disposed on the first substrate and has a first opening adjacent to a first edge of the first substrate and a second opening adjacent to the first opening. The first color block and the second color block are respectively disposed on the light shielding layer along a first direction. The first opening is filled with partial of the first color block, and the first color block overlaps partial of the light shielding layer. The second opening is filled with partial of the second color block, and the second color block overlaps partial of the light shielding layer. The first color block on the light shielding layer has a first overlap portion closest to the first edge. The second color block on the light shielding layer has a second overlap portion closest to the first edge. There is a first shortest distance from the first overlap portion to the first edge, there is a second shortest distance from the second overlap portion to the first edge, and the first shortest distance and the second shortest distance are different. The display medium layer is sandwiched between the first substrate and the second substrate.

In one embodiment, along the first direction, there is a first shortest distance from the first overlap portion to the first edge, there is a second shortest distance from the second overlap portion to the first edge, and the first shortest distance and the second shortest distance are different.

In one embodiment, the first color block and the second color block have different colors.

In one embodiment, the thickness of the first overlap portion is thinner than the thickness of partial of the first color block at the first opening.

In one embodiment, the ratio of the area of the first overlap portion to the area of the first opening is between 0.3 to 1.2.

In one embodiment, the light shielding layer further comprises a third opening relatively away from the first edge along the first direction, the third opening is filled with partial of the first color block, and the area of the third opening is greater than the area of the first opening.

In one embodiment, the first color block overlaps the light shielding layer and has a third overlap portion. The second color block overlaps the light shielding layer and has a fourth overlap portion. The first overlap portion is located between the third overlap portion and the first edge. The second overlap portion is located between the fourth overlap portion and the first edge. A spacer disposed across partial of the third overlap portion and the fourth overlap portion. The overlap area between the spacer and the third overlap portion is different from the overlap area between the spacer and the fourth overlap portion.

In one embodiment, the display panel further includes a third color block closest to a second edge. The third color block is disposed on the light shielding layer along the first direction. The light shielding layer further has a third opening relatively away from the first edge. The second edge connects to the first edge. Along a second direction substantially perpendicular to the first direction, there is a third shortest distance from the portion of the third color block corresponding to the first opening to the second edge, and there is a fourth shortest distance from the portion of the third color block corresponding to the third opening to the second edge, the third shortest distance and the fourth shortest distance are different.

In one embodiment, the first overlap portion connects to the second overlap portion to form a concave portion, there is a first longest distance from the concave portion to the first edge along the first direction, there is a fifth shortest distance from the first color block or the second color block to the first edge along the first direction, the ratio of the difference between the first longest distance and the fifth shortest distance to the length of the first opening is between 0.05 to 0.5.

As mentioned above, as to the display panel, the first color block and the second color block are respectively disposed on the light shielding layer along the first direction. The first opening is filled with partial of the first color block, and the first color block overlaps partial of the light shielding layer. The second opening is filled with partial of the second color block, and the second color block overlaps partial of the light shielding layer. The area of the first overlap portion of the first color block on the light shielding layer closest to the first edge is different from the area of the second overlap portion of the second color block on the light shielding layer closest to the first edge; alternatively, the first shortest distance from the first overlap portion to the first edge is different from the second shortest distance from the second overlap portion to the first edge; alternatively, the third color block closest to the second edge is disposed on the light shielding layer along the first direction, along the second direction substantially perpendicular to the first direction, the shortest distance from the portion of the third color block corresponding to the first opening to the second edge is different from the shortest distance from the portion of the third color block corresponding to the third opening to the second edge. Therefore, the border between the light shielding layer and the color block of the display panel is not aligned evenly. It can form a heterogeneous boundary to block the external particle or moisture from entering the panel through the border between the light shielding layer and the color block. It can prevent the particle pollution by external particle, and therefore raises product reliability and competitiveness.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1A:
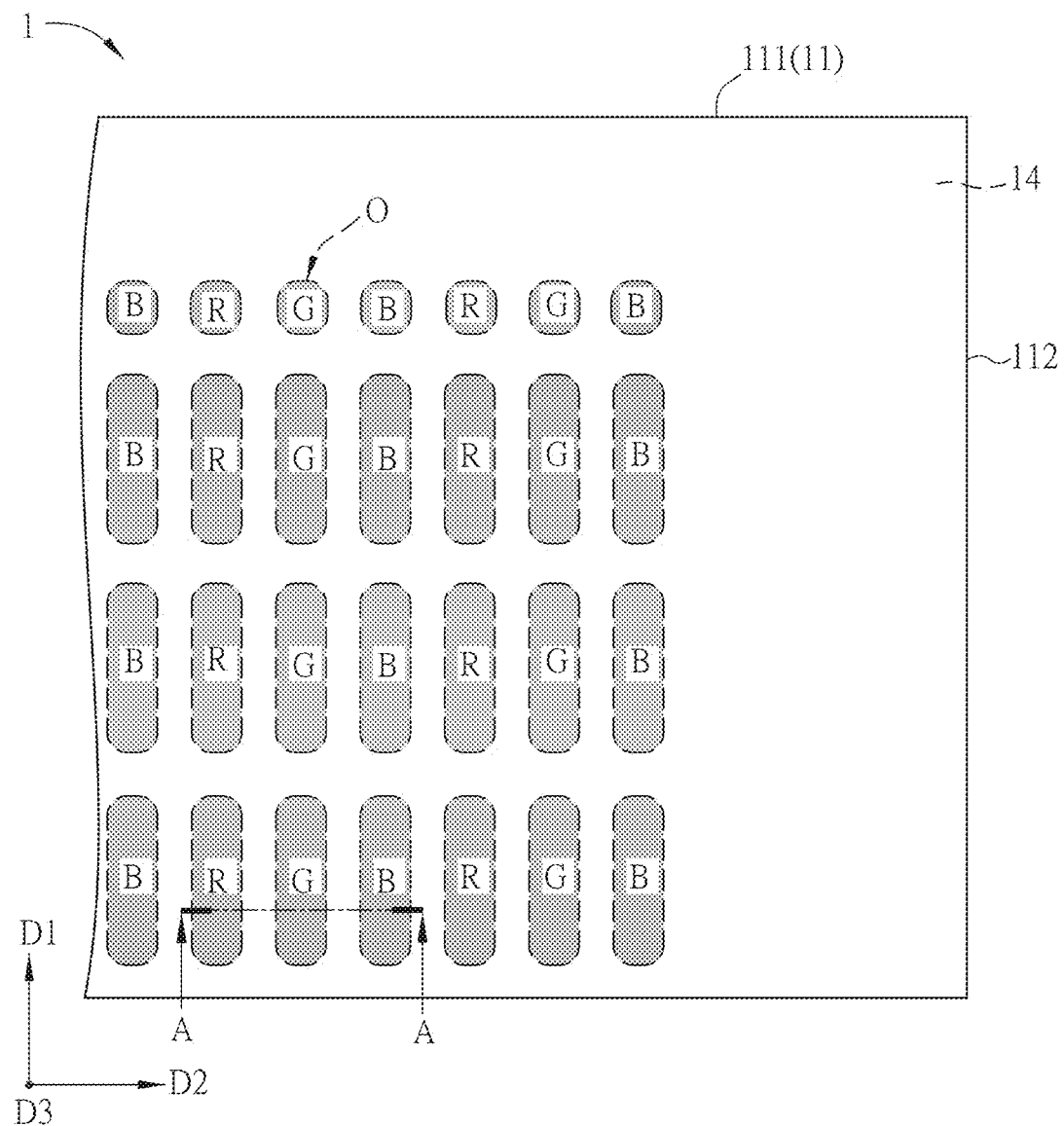
FIG. 1A is a schematic top view showing a display panel according to the embodiment of the invention.
Figure 1B:
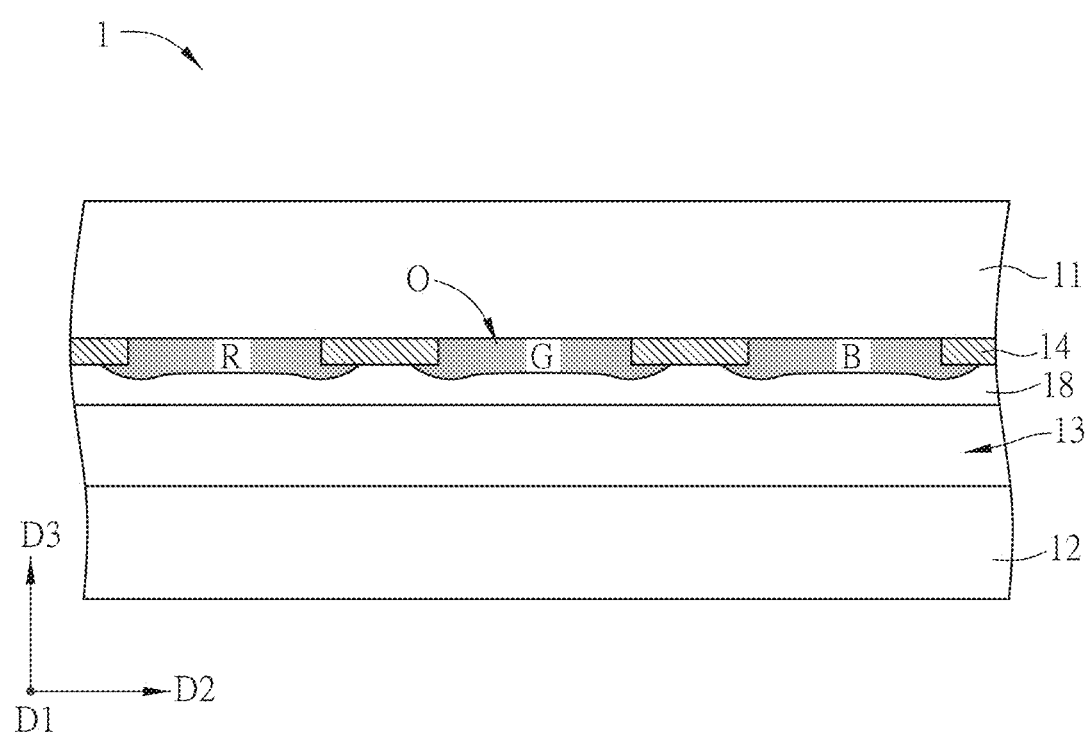
FIG. 1B is a sectional view along line A-A in FIG. 1A.
Figure 1C:
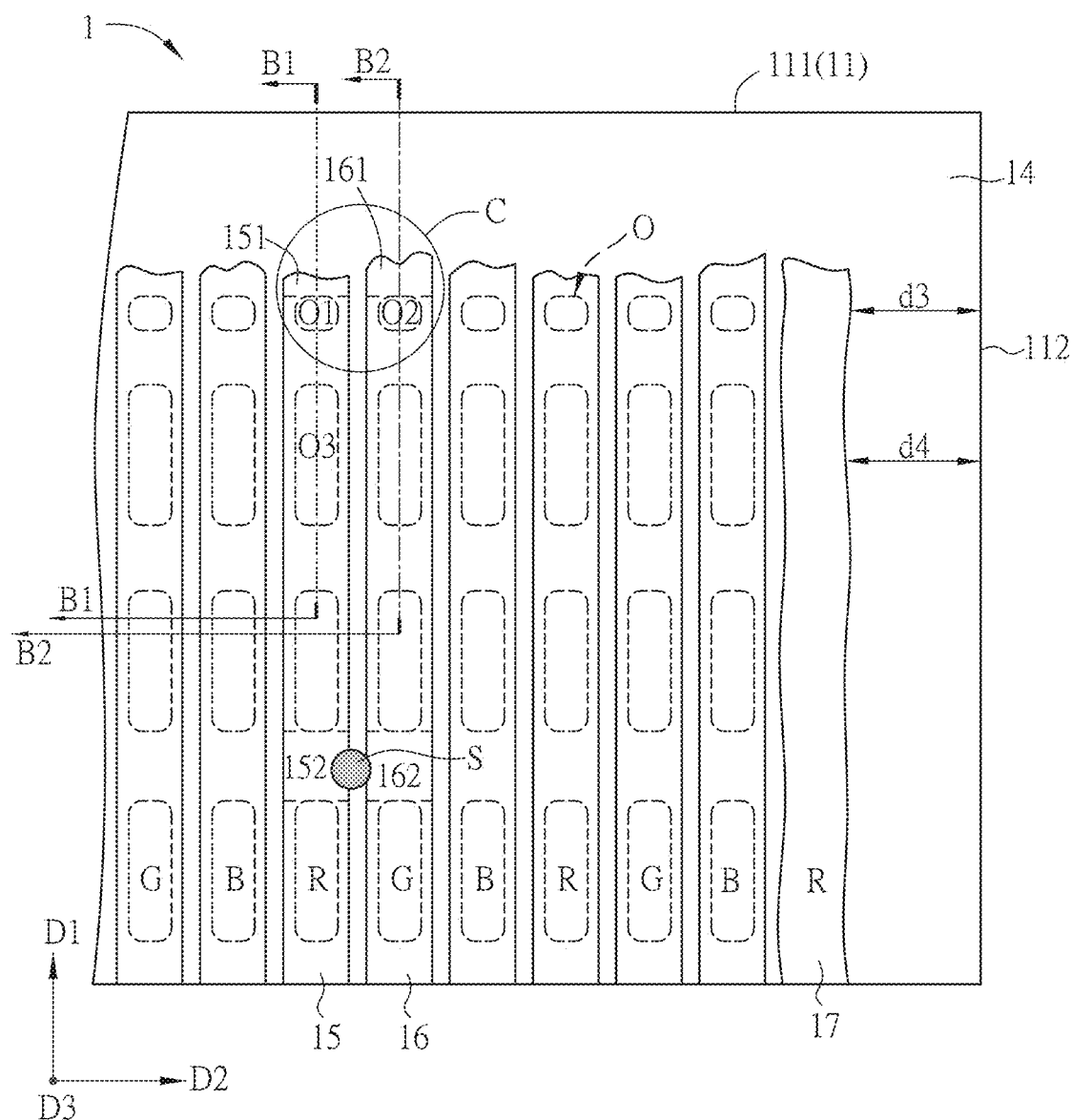
FIG. 1C is a schematic bottom view showing the display panel in FIG. 1B.
Figure 1D:
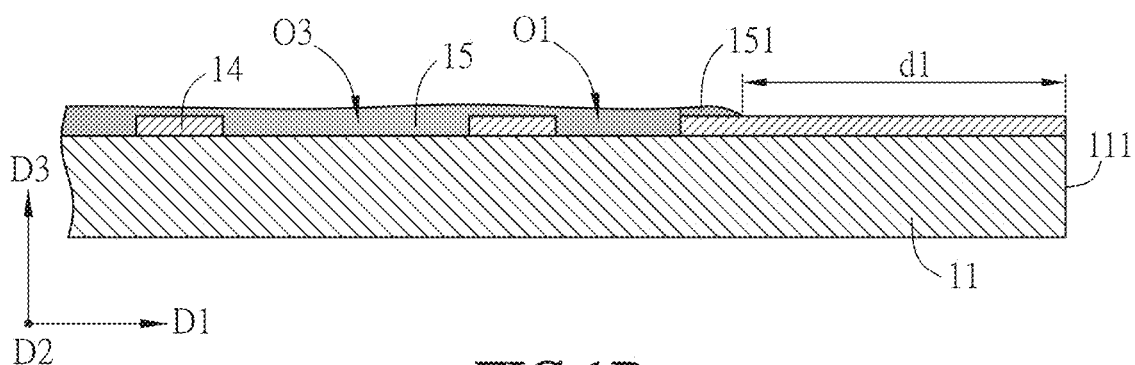
FIG. 1D and FIG. 1E are sectional views respectively along line B1-B1 and line B2-B2 in FIG. 1C.
Figure 1E:
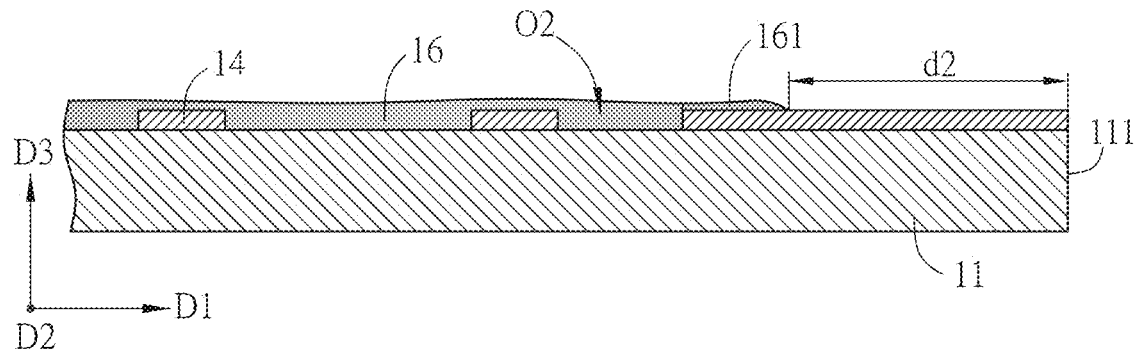
Figure 1F:
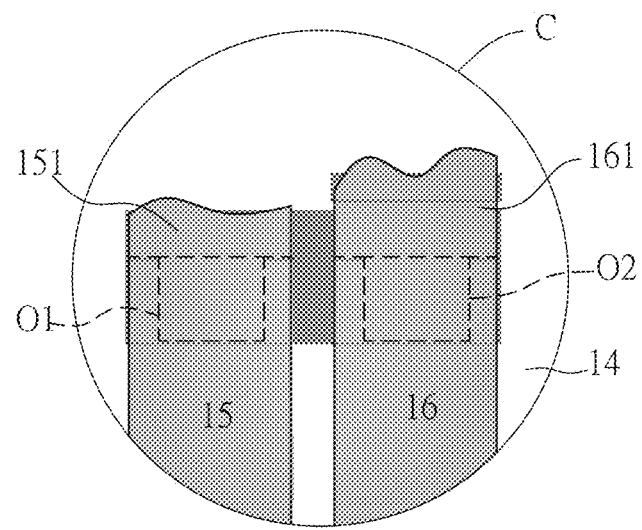
FIG. 1F is an enlarged schematic view showing the zone C in FIG. 1C.

Referring to FIG. 1A to FIG. 1F, FIG. 1A is a schematic top view showing a display panel 1 according to the embodiment of the invention. FIG. 1B is a sectional view along line A-A in FIG. 1A. FIG. 1C is a schematic bottom view showing the display panel in FIG. 1B. FIG. 1D and FIG. 1E are sectional views respectively along line B1-B1 and line B2-B2 in FIG. 1C. FIG. 1F is an enlarged schematic view showing the zone C in FIG. 1C.

In FIG. 1B, the display panel 1 includes a first substrate 11, a second substrate 12 and a display medium layer 13. In addition, the display panel 1 further includes a light shielding layer 14, a filter layer and a protection layer 18. In FIG. 1A, FIG. 1C, FIG. 1D and FIG. 1E, the second substrate 12, the display medium layer 13 and the protection layer 18 are not shown. Besides, a first direction D1, a second direction D2 and a third direction D3 are shown in the figure, and the first direction D1, the second direction D2 and the third direction D3 are substantially perpendicular to each other. The first direction D1 can be substantially parallel to the extension direction of the data line. The second direction D2 can be substantially parallel to the extension direction of the scan line. The third direction D3 is another direction which is substantially perpendicular to the first direction D1 and the second direction D2.

The first substrate 11 is disposed opposite to the second substrate 12. The display medium layer 13 is sandwiched between the first substrate 11 and the second substrate 12. The display panel 1 can be an LCD (liquid crystal display) panel or an OLED (Organic Light-Emitting Diode) display panel. Here, the display panel 1 is the LCD panel for example, and the display medium layer 13 is a liquid crystal layer. Alternatively, if the display panel 1 is an OLED display device, the display medium layer 13 can be an organic light emitting layer, and the first substrate 11 can be a cover plate to protect the organic light emitting layer from external moisture or particle pollution. The first substrate 11 or the second substrate 12 can be made of transparent material, for example, glass, quartz or the like, plastic, rubber, fiberglass, or other polymer material; alternatively, the first substrate 11 or the second substrate 12 can be made of opaque material, for example metal-fiberglass composite plate, metal-ceramic composite plate, printed circuit board, or other material. In the embodiment, the material of the first substrate 11 or the second substrate 12 is transparent glass for example.

The light shielding layer 14 and the filter layer are disposed on the first substrate 11. In the embodiment, the light shielding layer 14 and the filter layer are included in a color filter array disposed on the first substrate 11, so the first substrate 11 with the color filter array becomes a color filter substrate. In addition, a TFT (thin film transistor) array can be disposed on the second substrate 12, so the second substrate 12 with the TFT array becomes a TFT substrate. Alternatively in other embodiments, the light shielding layer 14 and/or the filter layer may be respectively disposed on the second substrate 12, so it becomes a BOA (black matrix on array) substrate or becomes a COA (color filter on array) substrate, and it is not limited thereto.

The light shielding layer 14 includes a plurality of openings O. The openings O are the regions which the light could be transmitted (the region other than the opening O is light shielding layer 14). The light shielding layer 14 can be a black matrix and made of opaque material, for example metal or resin. For example, metal can be chromium, chromic hydroxide, or nitrogen oxide chromium compounds. Because the light shielding layer 14 is opaque, it forms an opaque region on the substrate 11 to further define a region with light transmittance. Referring to FIG. 1C, the openings O includes a first opening O1 adjacent to a first edge 111 of the first substrate 11 and a second opening O2 adjacent to the first opening O1. In the embodiment, among the openings O of the shielding layer 14, the first opening O1 and the second opening O2 are the adjacent openings closest to the first edge 111 of the first substrate 11. The dimensions of the first opening O1 and the second opening O2 are relatively smaller than other openings O that are not closest to the first edge 111 of the first substrate 11.

Besides, the filter in the embodiment for example but not limited to includes color blocks in three kinds of colors which are arranged repeatedly (R represents red color, G represents green color and B represents blue color in the figure). Its material can be transparent material for example pigment or dye. The filter layer can include a first color block 15 and a second color block 16 adjacent to the first color block 15. The first color block 15 and the second color block 16 have different colors. In the embodiment for example, the first color block 15 is red R, the second color block 16 is green G, but they are not limited thereto. The first color block 15 and the second color block 16 are respectively disposed along a first direction D1 and cover partial of the light shielding layer 14. In manufacturing process, after forming the light shielding layer 14 having a plurality of openings O on the first substrate 11, along the first direction D1 the first color block 15 and the second color block 16 are respectively formed on the light shielding layer 14. Thus, the first opening O1 is filled with partial of the first color block 15 along the first direction D1 and the first color block 15 overlaps partial of the shielding layer 14, and the second opening O2 is filled with partial of the second color block 16 along the first direction D1 and the second color block 16 overlaps partial of the shielding layer 14.

The first color block 15 overlaps partial of the shielding layer 14. Thus, the first color block 15 on the shielding layer 14 has a first overlap portion 151 closest to the first edge 111 (the first overlap portion 151 is adjacent and connected to the first opening O1, the side of the first opening O1 closest to the first edge 111 has a tangent line parallel to the first edge 111, and the tangent line also acts as a virtual border of the first overlap portion 151). The second color block 16 overlaps partial of the shielding layer 14. Thus, the second color block 16 on the shielding layer 14 has a second overlap portion 161 closest to the first edge 111 (the second overlap portion 161 is adjacent and connected to the second opening O2, and the side of the second opening O2 closest to the first edge 111 has a tangent line parallel to the first edge 111, and the tangent line also acts as a virtual border of the second overlap portion 161). Referring to FIG. 1F, the area of the first overlap portion 151 and the area of the second overlap portion 161 are different. Here, the area of the first overlap portion 151 is smaller than the area of the second overlap portion 161.

In other words, in the embodiment, as to the same color block (for example color block R), it forms a plurality of overlap portions when disposed on the light shielding layer 14. The overlap portion closest to the first edge 111 is regarded as the first overlap portion 151. Similarly, as to color block G, it also forms a plurality of overlap portions when disposed on the light shielding layer 14. The overlap portion closest to the first edge 111 is regarded as the second overlap portion 161. Because the area of the first overlap portion 151 is different from the area of the second overlap portion 161, a heterogeneous edge is formed. In addition, referring to FIG. 1D and FIG. 1E, along the first direction D1, there is a first shortest distance d1 between the first overlap portion 151 and the first edge 111, there is a second shortest distance d2 between the second overlap portion 161 and the first edge 111, and the first shortest distance d1 and the second shortest distance d2 are different. Here, the first shortest distance d1 is greater than the second shortest distance d2. Therefore, in this embodiment, the edge of the first color block 15 and the second color block 16 closet to the first edge 111 of the first substrate 11 are not aligned evenly and thus to form a heterogeneous boundary. It is easier to block external particle or moisture from entering the display panel 1 through the edge of the color block. It prevents the pollution by external particle, and therefore raises product reliability and competitiveness.

Besides, referring to FIG. 1D, the thickness of the first overlap portion 151 is thinner than the thickness of the partial of the first color block 15 at the first opening O1. In one embodiment for example, the thickness of the first overlap portion 151 is about 1.1 μm, and the thickness of the first color block 15 at the first opening O1 is about 1.8 μm. Similarly, the thickness of the second overlap portion 161 is also thinner than the thickness of the partial of the second color block 16 at the second opening O2. Therefore, the filter layer has better flatness.

Besides, as to the same color block, when the ratio of the area of the overlap portion closest to the first edge 111 of the first substrate 11 with respect to the area of the first opening O1 is within a specific range, an adhesion between the color block and the light shielding layer 14 can be increased (if the ratio is too high, it can not form the heterogeneous edge to block external particle; if the ratio is too low, the reliability is poor). In the embodiment, the ratio of the area of the first overlap portion 151 to the area of the first opening O1 is between 0.3 and 1.2. Here, the area of the first opening O1 is equal to the projected area of the first color block 15 which the first opening O1 is filled with.

Referring to FIG. 1C again, the openings O of the light shielding layer 14 further includes a third opening O3 relatively away from the first edge 111 along the first direction D1. The third opening O3 is filled with partial of the first color block 15, and the area of the third opening O3 is greater than the area of the first opening O1. Here, the area of the third opening O3 greater than the area of the first opening O1 means that: the projected area of the first color block 15 which the third opening O3 is filled with is greater than the projected area of the first color block 15 which the first opening O1 is filled with. FIG. 1C shows that the third opening O3 and the first opening O1 are adjacent openings. Alternatively, the third opening O3 may be toward the first direction D1 and it is not adjacent to the first opening O1, and it is not limited thereto.

Besides, in the embodiment, the first color block 15 overlaps the light shielding layer 14 and has a third overlap portion 152. The second color block 16 overlaps the light shielding layer 14 and has a fourth overlap portion 162. The first overlap portion 151 is located between the third overlap portion 152 and the first edge 111. The second overlap portion 161 is located between the fourth overlap portion 162 and the first edge 111. In addition, a spacer S can disposed across the third overlap portion 152 and the fourth overlap portion 162. The material of the spacer S can be resin, silicate, fiberglass, or other photosensitive resist material, and it is not limited thereto. The spacer S keeps an interval between the first substrate 11 and the second substrate 12, so as to supply the accommodation space filled by the liquid crystal molecules. In the embodiment, the overlap area between the spacer S and the third overlap portion 152 is different from the overlap area between the spacer S and the fourth overlap portion 162. Here, the overlap area between the spacer S and the third overlap portion 152 is greater than the overlap area between the spacer S and the fourth overlap portion 162. In addition, although FIG. 1C only shows one spacer S, actually, the display panel 1 has a plurality of the spacers S.

Besides, the first substrate 11 further includes a second edge 112 connecting to the first edge 111. The color filter layer further includes a third color block 17 closest to the second edge 112. The term "closest to" means that there is no other color block between the third color block 17 and the second edge 112. The color of the third color block 17 may be the same with or different from that of the first color block 15 or the second color block 16. The third color block 17 is disposed on the light shielding layer 14 along the direction D1. Although the third color block 17 closest to the second edge 112 is disposed, the third color block 17 will not be seen when overlooking the first substrate 11 because the third color block 17 is not injected into any opening O. But as shown in FIG. 1C, the third color block 17 is seen when looking up and seeing the first substrate 11. Along the second direction D2, there is a third shortest distance d3 from the portion of the third color block 17 corresponding to the first opening O1 to the second edge 112. Along a second direction D2, there is a fourth shortest distance d4 from the portion of the third color block 17 corresponding to the third opening O3 to the second edge 112. The third shortest distance d3 is different from the fourth shortest distance d4. Thus similarly, the edge of the third color block 17 closest to the second edge 112 is also not aligned evenly. Thus, the edge of the third color block 17 also forms a heterogeneous boundary. It is easier to block external particle or moisture from entering the display panel 1 through the edge of the third color block 17. Therefore it raises product reliability.

Besides, referring to FIG. 1B again, the protection layer 18 (for example over-coating) can cover the light shielding layer 14 and the color filter layer. The material of the protection layer 18 can be photoresist, resin material, or inorganic materials (for example SiOx/SiNx), etc. to protect the light shielding layer 14 and the color filter layer from damage due to follow-up manufacturing process. In addition, the display panel 1 further includes a sealant (not shown in the figure). The sealant is disposed between the first substrate 11 and the second substrate 12 to enclose the peripheral between the first substrate 11 and the second substrate 12. The sealant is disposed corresponding to the periphery light shielding layer 14 of the display panel 1. Thus, when looking down the display panel 1, the sealant is covered by the light shielding layer 14. The sealant may be light curing adhesive (for example UV curing adhesive) and it is applied to and surrounds the fringes of display area between the first substrate 11 and the second substrate 12 for example but not limited to. In addition, the sealant, the first substrate 11 and the second substrate 12 may form an accommodation space (not shown in the figure), and the display medium layer 13 can be disposed in the accommodation space. Here, for example but not limited to, ODF (one drop filling) is utilized to fill the accommodation space enclosed by the sealant with the liquid crystal molecules.

In addition, the display panel 1 may further includes a plurality of scan lines and a plurality of data lines (no shown in the figure). The scan lines and the data lines are interlaced to define a plurality of pixels. Therefore, when the scan lines of the display panel 1 receive a scan signal, the TFTs corresponding to the respective scan lines are accordingly conducted and data signals corresponding to the respective pixel of column are transmitted to the corresponding pixels by the data lines. Thus the display panel 1 can display image screen.

Figure 2:
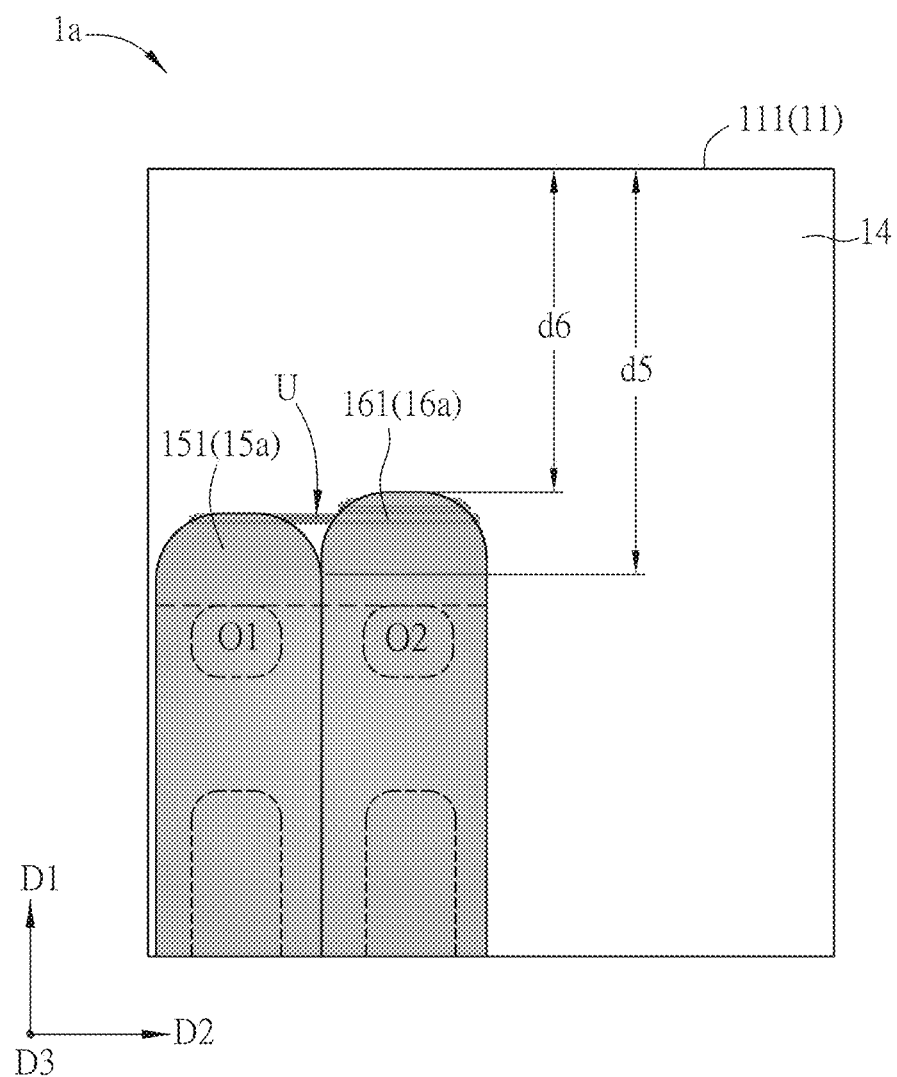
FIG. 2 is a schematic bottom view showing a display panel according to another embodiment of the invention.

Referring to FIG. 2, it is a schematic bottom view showing a display panel 1a according to another embodiment of the invention. Here, only the first color block 15a and the second color block 16a of the color filter layer are shown in the display panel 1a in FIG. 2. Other color blocks, the second substrate 12, the display medium layer 13 and the protection layer 18 are also not shown.

The display panel 1a has the same elements and features with those of the display panel 1. However, the difference from the display panel 1 in FIG. 1C is that along the third direction D3, the first overlap portion 151 of the first color block 15a and the second overlap portion 161 of the second color block 16a connects to form a concave portion U (namely, along the third direction D3, an interval exist between the first overlap portion 151 and the second overlap portion 161). There is a first longest distance d5 from the concave portion U to the first edge 111 along the first direction D1, there is a fifth shortest distance d6 from the first color block 15a or the second color block 16a to the first edge 111. Here, it shows that the ratio of the difference between the first longest distance d5 and the fifth shortest distance d6 with respect to the length of the first opening O1 is between 0.05 and 0.5. The length of the first opening O1 means the maximum length of the first opening O1 along the first direction D1. The concave portion U (namely, the interval between the two) formed by the first overlap portion 151 and the second overlap portion 161 form a heterogeneous boundary at the edge of the color filter layer. Further, when the sealant is disposed here (the edge of the filter layer), it increases the contact area of the sealant and the color filter layer thus to enhance the adhesion property of the seal agent and the color filter layer.

Besides, the technique features of other elements of the display panel 1a can refer to those of the display device 1, they are not repeated here again.

Figure 3:
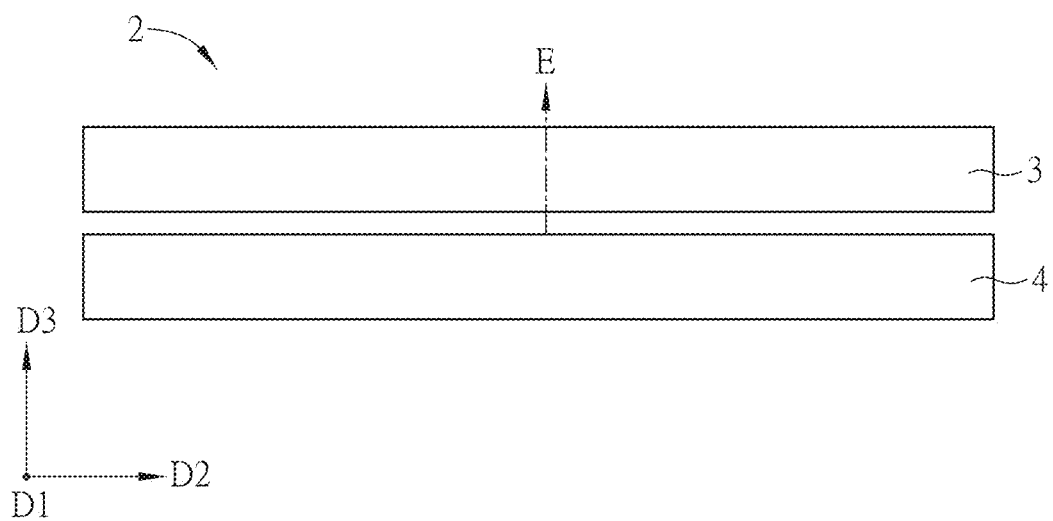
FIG. 3 is a schematic view showing a display panel according to the embodiment of the invention.

Besides, Referring to FIG. 3, it is a schematic view showing a display panel 2 according to the embodiment of the invention.

The display device 2 includes a display panel 3 and a backlight module 4. The display panel 3 and the backlight module 4 are disposed opposite to each other. The display device 2 in the embodiment is an LCD device, and the display panel 3 employs one of the above mentioned display panel 1, 1a, or other various implementation. Because specific technique contents can refer to the above, they are not repeated here again. When the light beam E emitted from the backlight module 4 passes through the display panel 3, it displays colors to form an image by each pixel of the display panel 3.

As mentioned above, as to the display panel, the first color block and its adjacent second color block are respectively disposed on the light shielding layer along the first direction. The first opening is filled with partial of the first color block, and the first color block overlaps partial of the light shielding layer. The second opening is filled with partial of the second color block, and the second color block overlaps partial of the light shielding layer. The area of the first overlap portion of the first color block closest to the first edge on the light shielding layer is different from the area of the second overlap portion of the second color block closest to the first edge on the light shielding layer; alternatively, the first shortest distance of the first overlap portion to the first edge is different from the second shortest distance of the second overlap portion to the first edge; alternatively, the third color block closest to the second edge is disposed on the light shielding layer along the first direction. Along the second direction substantially perpendicular to the first direction, the shortest distance from the portion of the third color block corresponding to the first opening to the second edge is different from the shortest distance from the portion of the third color block corresponding to the third opening to the second edge. Therefore, the border between the light shielding layer and the color block of the display panel is not aligned evenly. It can form a heterogeneous boundary to block the external particle or moisture from entering the panel through the border between the light shielding layer and the color block. It prevent the display panel from the pollution by external particle, and therefore raises product reliability and competitiveness.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
   a first substrate comprising a first surface with a normal direction perpendicular to the first surface;
   a second substrate disposed opposite to the first substrate, wherein the first surface faces the second substrate, and the first surface has a first edge and a second edge, the second edge is connected to the first edge, the second edge substantially extends along a first direction perpendicular to the normal direction, the first edge substantially extends along a second direction perpendicular to the normal direction, and the first direction is different from the second direction;
   a light shielding layer disposed between the first substrate and the second substrate and disposed on the first surface, the light shielding layer including a plurality of openings; and
   a color block closest to the second edge, disposed on the light shielding layer and extending along the first direction, wherein the color block is not overlapped the plurality of openings when viewed in the normal direction, the color block has a third edge extending along the first direction, the third edge is closest to the second edge, and the third edge is not aligned evenly along the first direction when viewed in the normal direction.

2. The display panel of claim 1, wherein a virtual extension line is parallel to the first direction and distances from the third edge to the virtual extension line are different.

3. The display panel of claim 1, wherein a virtual extension line is parallel to the first direction, along the second direction, a distance from the third edge corresponding to one of the plurality of openings to the virtual extension line and a distance from the third edge not corresponding to the one of the plurality of openings to the virtual extension line is different.

4. The display panel of claim 1, further comprising:
   a first color block, disposed on the light shielding layer along the first direction, wherein one of the plurality of openings is filled with the first color block.

5. The display panel of claim 4, further comprising:
   a second color block, disposed on the light shielding layer along the first direction, wherein another one of the plurality of openings is filled with the second color block.

6. The display panel of claim 5, wherein the second color block is disposed between the color block and the first color block.

7. The display panel of claim 6, further comprising:
   a spacer, disposed between the first color block and the second color block, and the spacer is not overlapping with the plurality of openings.

8. The display panel of claim 5, wherein the first color block and the second color block have different colors.

9. The display panel of claim 1, wherein a virtual extension line is parallel to the first direction and between the third edge and the second edge, wherein along the second direction, the third edge comprises a convex portion near to the virtual extension line and a concave portion away from the virtual extension line.

10. The display panel of claim 1, wherein along the first direction, the color block has a fourth edge opposite to the third edge of the color block, and the fourth edge extends along the first direction and is not aligned evenly along the first direction when viewed in the normal direction.

11. The display panel of claim 10, wherein a virtual extension line is parallel to the first direction and between the third edge and the second edge, wherein along the first direction, the third edge comprises a convex portion near to the virtual extension line and a concave portion away from the virtual extension line.

12. The display panel of claim 11, wherein the fourth edge comprises a concave portion near to the virtual extension line and a convex portion away from the virtual extension line.

13. The display panel of claim 12, wherein the concave portion of the third edge is corresponding to the convex portion of the fourth edge.

14. The display panel of claim 12, wherein the convex portion of the third edge is corresponding to the concave portion of the fourth edge.

15. The display panel of claim 1, wherein the color block has an another edge, the another edge extends along the second direction perpendicular to the first direction and the another edge is not aligned evenly along the second direction when viewed in the normal direction.

16. The display panel of claim 15, wherein an another virtual extension line is parallel to the second direction and distances from the another edge to the another virtual extension line are different.

17. The display panel as in claim 1, wherein the color block is between the second edge and the plurality openings.

18. The display panel as in claim 1, wherein at least part of the third edge is curved when viewed in the normal direction.

\* \* \* \* \*